United States Patent
Lee et al.

[11] Patent Number: 6,071,773
[45] Date of Patent: Jun. 6, 2000

[54] PROCESS FOR FABRICATING A DRAM METAL CAPACITOR STRUCTURE FOR USE IN AN INTEGRATED CIRCUIT

[75] Inventors: Jin-Yuan Lee; Mong-Song Liang, both of Hsin-Chu, Taiwan

[73] Assignee: Taiwan Semiconductor Manufacturing Company, Hsin-Chu, Taiwan

[21] Appl. No.: 09/166,393

[22] Filed: Oct. 5, 1998

[51] Int. Cl.[7] .................. H01L 21/8242; H01L 21/8249; H01L 21/8234; H01L 21/331
[52] U.S. Cl. .................. 438/253; 438/235; 438/238; 438/240; 438/254; 438/255; 438/396; 438/397; 438/398
[58] Field of Search ...................... 438/235, 238, 438/239, 240, 253, 254, 255, 396, 397, 398

[56] References Cited

U.S. PATENT DOCUMENTS

| | | | |
|---|---|---|---|
| 5,281,837 | 1/1994 | Kohyama | 257/296 |
| 5,604,146 | 2/1997 | Tseng | 438/253 |
| 5,627,095 | 5/1997 | Koh et al. | 438/672 |
| 5,643,819 | 7/1997 | Tseng | 438/396 |
| 5,691,223 | 11/1997 | Pittikoun et al. | 437/52 |
| 5,728,618 | 3/1998 | Tseng | 438/253 |

*Primary Examiner*—Brian Dutton
*Assistant Examiner*—Brook Kebede
*Attorney, Agent, or Firm*—George O. Saile; Stephen B. Ackerman

[57] ABSTRACT

A process for fabricating a DRAM metal capacitor structure, featuring simultaneous formation of specific bit line, and storage node features, has been developed. The DRAM capacitor storage node is comprised of a stack of tungsten interconnect structures, overlying specific insulator layers, connected by tungsten plugs, formed in the specific insulator layers. Removal of a portion of the upper level insulator layers, exposes a stack of tungsten plugs and tungsten interconnects, that comprise the metal storage node structure, for the DRAM metal capacitor structure. The process of fabricating the DRAM metal capacitor structure, features the simultaneous formation of a tungsten bit line contact plug, and a tungsten storage node contact plug, in addition to the simultaneous formation of a tungsten bit line interconnect structure, and a tungsten interconnect structure, used as components of the DRAM metal capacitor structure.

24 Claims, 7 Drawing Sheets

PROCESS FOR FABRICATING A DRAM METAL CAPACITOR STRUCTURE FOR USE IN AN INTEGRATED CIRCUIT

BACKGROUND OF THE INVENTION (1) Field of the Invention

The present invention relates to fabrication procedures used to create semiconductor devices, and more specifically to a process used to integrate the fabrication of a DRAM, metal capacitor structure, with some of the fabrication procedures used for logic devices.

(2) Description of Prior Art

Advanced semiconductor chips, now being manufactured in industry, are composed of logic or memory devices. Logic devices are used to process information or data, while memory devices are used for data storage. These two types of devices can be found in almost all computers, however they are usually found on specific chips, reserved for either logic or memory applications. In systems in which logic and memory devices are packaged separately, data signals between the two may have to pass through several levels of packaging, which can result in undesirable propagation delays. In addition the manufacturing costs for fabricating wafers producing only logic chips, and wafers with only memory chips, are greater than if both logic and memory applications can be incorporated on the same chip. Therefore for performance and cost reasons the semiconductor industry has been motivated to produce a semiconductor chip with both the desired logic and memory requirements.

This invention will describe a novel process sequence for forming a capacitor structure, for a dynamic random access memory, (DRAM), cell, while simultaneously fabricating the DRAM bit line structure, and simultaneously forming specific elements for adjacent logic devices. The use of shared process sequences, for both memory and logic devices, on the same semiconductor chip, increase the performance of both the logic and memory devices, while still reducing processing costs. The key feature of this invention is the formation of a metal storage node structure, for the DRAM capacitor, located over a bit line structure, fabricated simultaneously with the formation of the DRAM bit line structure, and with some of the wiring levels, used for the logic devices. The use of a low resistivity metal, for the storage node of the capacitor, allows this material, and process sequence, to be simultaneously used for high conductivity wiring levels, needed for adjacent logic devices. Prior art, such as Koh et al, in U.S. Pat. No. 5,627,095, describe a capacitor structure, formed over a bit line structure, however this prior art uses a polysilicon capacitor structure, not compatible, in terms of conductivity, with the needs of logic devices.

SUMMARY OF THE INVENTION

It is an object of this invention to provide a process for fabricating a capacitor structure, for a dynamic random access memory, (DRAM), device, using some of the same processing materials and sequences, used to fabricate a metal oxide semiconductor field effect, (MOSFET), logic device, on the same semiconductor chip, or integrated circuit.

It is another object of this invention to fabricate a storage node structure for the DRAM device, using metal plugs, and metal interconnect levels, formed simultaneously with the metal plugs and metal interconnect structures, formed for the DRAM bit line structure.

It is yet another object of this invention to create a DRAM storage node structure, by placing additional metal plugs, and metal interconnect levels, on the underlying metal plugs and metal interconnect structures, that were previously formed during the creation of the DRAM bit line structure.

In accordance with the present invention a fabrication process is described for fabricating a metal capacitor structure, for a DRAM device, using some of the identical process steps used to fabricate the DRAM bit line structure, and for some of the identical process steps used for MOSFET logic devices. A first iteration of this invention entails the creation of a first level, bit line metal contact plug, in a first insulator layer, contacting a source region, of a source/drain region, used for bit line purposes, and formed simultaneously with a first level, DRAM metal contact plug, located on a source region, of a source/drain region, and used for DRAM capacitor purposes. A first level, bit line metal interconnect structure, is next formed overlying and contacting the first level, bit line metal contact plug, and formed simultaneously with a first level, DRAM metal interconnect structure, located overlying the first level, DRAM metal contact plug. A second level, DRAM metal plug, is then formed in a first via hole, in a second insulator layer, overlying and contacting, the top surface of the first level, DRAM metal interconnect structure. A second level, DRAM metal interconnect structure, is then formed overlying and contacting, the top surface of the second level, DRAM metal contact plug. A third level, DRAM metal plug, is formed in a second via hole, in a third insulator layer, overlying and contacting, the top surface of the second level, DRAM metal interconnect structure. Etch back of the third insulator layer, and a top portion of the second insulator layer, results in exposure of a storage node structure, comprised of the third level, DRAM metal plug, the second level, DRAM interconnect structure, and a top portion of the second level, DRAM metal plug. A capacitor dielectric layer is next formed on the storage node structure, followed by creation of another DRAM metal interconnect structure, used as the upper plate, for the DRAM capacitor structure.

A second iteration of this invention is the addition of a third level, DRAM metal interconnect structure, overlying, and contacting, the top surface of the third level, DRAM metal plug. Etch back of the third insulator layer, and of a top portion of the second insulator layer, now results in a storage node structure comprised of the third level, DRAM metal interconnect structure, the third level, DRAM metal plug, the second level, DRAM metal interconnect structure, and a top portion of the second level, DRAM metal plug.

A third iteration of this invention entails the use of polysilicon contact plugs, placed between, and self aligned to, transfer gate transistors, contacting underlying source regions, used for bit line, and for DRAM purposes. The series of metal contact plugs, and metal interconnect structures, used for the two previous iterations, are again created, overlying the polysilicon contact plugs.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The fabrication process used to form a DRAM capacitor structure, comprised of with a metal storage node structure, and with portions of the metal storage node structures, fabricated simultaneously with the DRAM bit line structure, and formed simultaneously with elements of a MOSFET logic device, will now be described in detail. The transfer gate transistors, used for the DRAM device described in this invention, are N channel, or NFET devices. If desired this invention can be applied to DRAM devices comprised of PFET transfer gate transistors.

Figure 1:
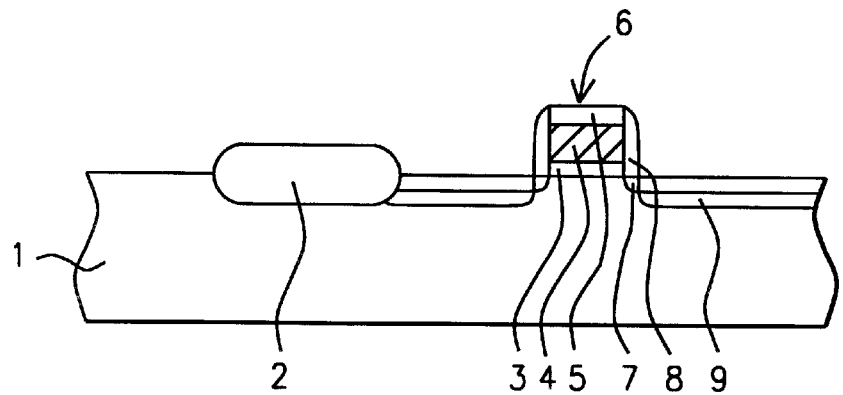
FIGS. 1–8, which schematically, in cross-sectional style, describe a first iteration of this invention in which a DRAM capacitor, storage node structure, is formed with a surface area comprised from a first metal plug structure, a metal interconnect, and a top portion of a second metal plug structure.

FIG. 1, describes the creation of the NFET, transfer gate transistor, used for a DRAM device. A P type, single crystalline silicon substrate 1, having a <100> crystallographic orientation is used. A field oxide, (FOX), region 2, is formed for purposes of isolation. The FOX region is formed by depositing a layer of silicon nitride on an underlying silicon dioxide layer, and using conventional photolithographic and RIE procedures to create the desired silicon nitride—silicon dioxide, composite oxidation mask. After photoresist removal using plasma oxygen ashing, followed by careful wet cleans, FOX region 2, is formed, in areas not covered by the composite oxidation mask, via oxidation in an oxygen—steam ambient, at a temperature between about 850 to 1050° C., to a thickness between about 3000 to 5000 Angstroms. The oxidation masking silicon nitride layer is removed via use of a hot phosphoric acid solution, followed by removal of the underlying silicon dioxide layer. If desired the isolation region can be an insulator filled shallow trench region, obtained via initially forming a shallow trench in the semiconductor substrate, via conventional photolithographic and anisotropic reactive ion etching, (RIE), procedures. After deposition of an insulator layer, such as silicon oxide, via low pressure chemical vapor deposition, (LPCVD), or plasma enhanced chemical vapor deposition, (PECVD), procedures, removal of unwanted insulator layer is accomplished via selective RIE, or chemical mechanical polishing, (CMP), procedures, resulting in the insulator filled, shallow trench, isolation regions.

A gate insulator layer 3, comprised of silicon dioxide, is thermally grown in an oxygen—steam ambient, at a temperature between about 700 to 1050° C., to a thickness between about 30 to 100 Angstroms, and shown schematically in FIG. 1. A layer of polysilicon 4, is next deposited using LPCVD processing, at temperature between about 500 to 650° C., to a thickness between 1500 to 4000 Angstroms. Polysilicon layer 4, can be doped in situ, during deposition, via the addition of arsine or phosphine, to a silane ambient, or polysilicon layer 4, can be deposited intrinsically, and doped via ion implantation procedures, using phosphorous or arsenic ions. In addition if lower word line resistance is required, polysilicon layer 4, can be replaced by a polycide layer, comprised of an overlying metal silicide layer, such as tungsten silicide, on an underlying polysilicon layer. An overlying insulator layer 5, such as silicon oxide, or silicon nitride, is next deposited using either LPCVD or PECVD procedures, to a thickness between about 500 to 1500 Angstroms. Conventional photolithographic and anisotropic RIE procedures, using $CF_4$ as an etchant for silicon nitride layer 4, ($CHF_3$ as an etchant for silicon oxide layer 4), and using $Cl_2$ as an etchant for polysilicon, or polycide layer 3, are employed to define a gate structure 6, schematically shown in FIG. 1.

After removal of photoresist shape used for the definition of gate structure 6, via plasma oxygen ashing and careful wet cleans, lightly doped source/drain region 7, is formed via ion implantation of either arsenic or phosphorous, at an energy between about 25 to 50 KeV, at a dose between about 1E13 to 5E14 atoms/cm². Insulator spacers 8, are next formed on the sides of the gate structure 6, via the deposition of a silicon oxide layer, or deposition of a silicon nitride layer, via LPCVD or PECVD procedures, to a thickness between about 1000 to 3000 Angstroms, followed by an anisotropic RIE procedure, using $CF_4$ as an etchant for silicon nitride, or using $CHF_3$ as an etchant for silicon oxide, creating the insulator spacers. Finally heavily doped source/drain region 9, shown schematically in FIG. 1, is formed via ion implantation of either arsenic or phosphorous, at an energy between about 20 to 80 KeV, at a dose between about 1E15 to 5E15 atoms/cm².

Figure 2:
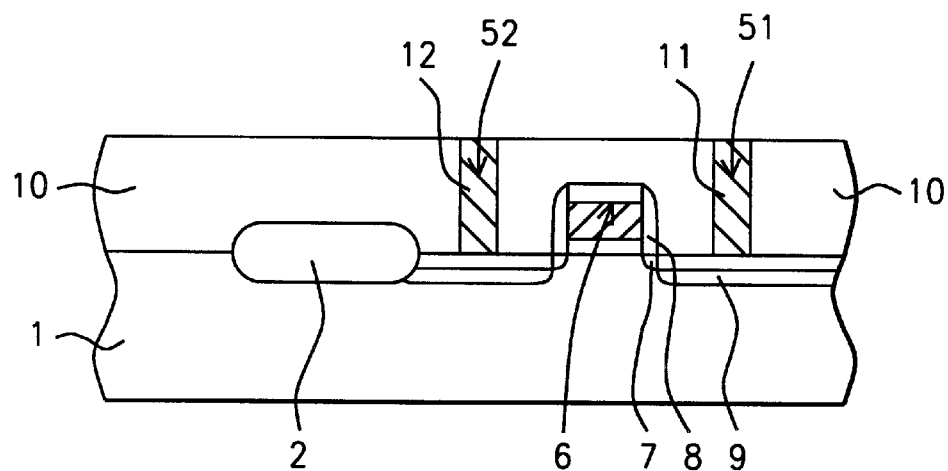

A first insulator layer 10, comprised of silicon oxide, is next deposited using LPCVD or PECVD procedures, to a thickness between about 5000 to 20000 Angstroms. A chemical mechanical polishing procedure is employed to planarize first insulator layer 10, resulting in a smooth top surface. Photolithographic and anisotropic RIE procedures, using $CHF_3$ as an etchant, are used to open bit line contact hole 51, and storage node contact hole 52, in insulator layer 10, exposing the top surface of source regions 9. This is schematically shown in FIG. 2. After removal of the photoresist shape used for definition of the contact holes, via plasma oxygen ashing and careful wet cleans, first level metal plugs are formed. If desired first level metal plugs can be formed from a layer of polysilicon, deposited using LPCVD procedures, to a thickness between about 3000 to 10000 Angstroms, completely filling bit line contact hole 51, and storage node contact hole 52. The polysilicon layer is doped in situ, during deposition, via the addition of either arsine or phosphine, to a silane ambient. Another option is the use of a metal layer, such as tungsten, with an underlying TiN barrier layer, in place of polysilicon, with the tungsten layer being obtained via LPCVD or R.F. sputtering procedures. Removal of unwanted polysilicon, or of tungsten, from the top surface of insulator layer 10, is accomplished using either a CMP procedure, or a selective RIE procedure, using $Cl_2$ as an etchant resulting in the formation of bit line contact plug 11, in bit line contact hole 51, and storage node contact plug 12, in storage node contact hole 52. This is schematically shown in FIG. 2.

Figure 3:
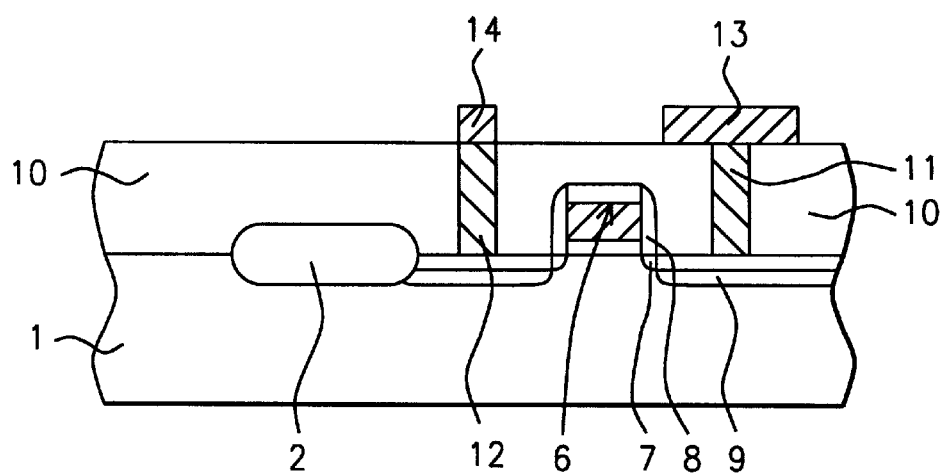
Figure 4:
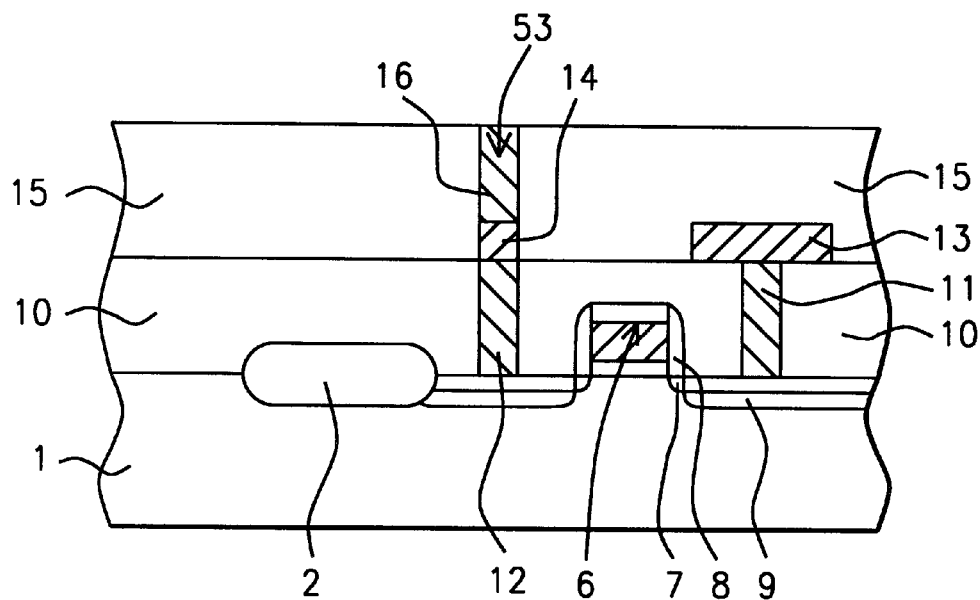

FIG. 3, schematically shows the simultaneous formation of bit line metal structure 13, and first level, DRAM metal interconnect structure 14. A metal, such as tungsten, is deposited via LPCVD or R.F. sputtering procedures, to a thickness between about 1000 to 5000 Angstroms. Photolithographic and anisotropic RIE procedures, using $Cl_2$ as an etchant, are used to simultaneously create bit line metal structure 13, overlying, and contacting, the top surface of bit line contact plug 11, and first level, DRAM metal interconnect structure 14, overlying, and contacting, the top surface of storage node contact plug 12. Removal of the photoresist shape used for these definitions is accomplished via plasma oxygen ashing and careful wet cleans. A second insulator layer 15, such as silicon oxide, is next deposited via LPCVD or PECVD procedures, to a thickness between about 5000 to 20000 Angstroms. A chemical mechanical polishing, (CMP), procedure, is used for planarization purposes, creating a smooth top surface topography for second insulator layer 15. A photolithographic and anisotropic RIE procedure, using $CHF_3$ as an etchant, is next used to open first via hole 53, in second insulator layer 15, exposing the top surface of first level, DRAM metal interconnect structure 14. After removal of the photoresist shape that was used for definition of first via hole 53, via plasma oxygen ashing and careful wet cleans, a metal layer, such as tungsten, is deposited using LPCVD or R.F. sputtering procedures, to a thickness between about 2000 to 5000 Angstroms, completely filling first via hole 53. A selective RIE procedure, or a CMP procedure, is next employed to remove unwanted metal from the top surface of second insulator layer 15, resulting in the formation of second level, DRAM metal plug 16, in first via hole 53. This is schematically shown in FIG. 4.

Figure 5:
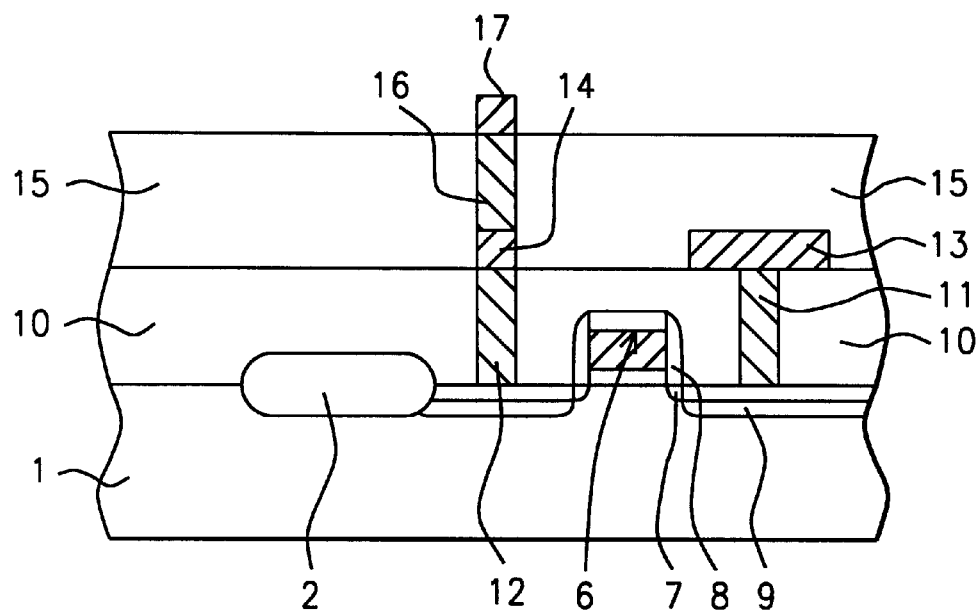
Figure 6:
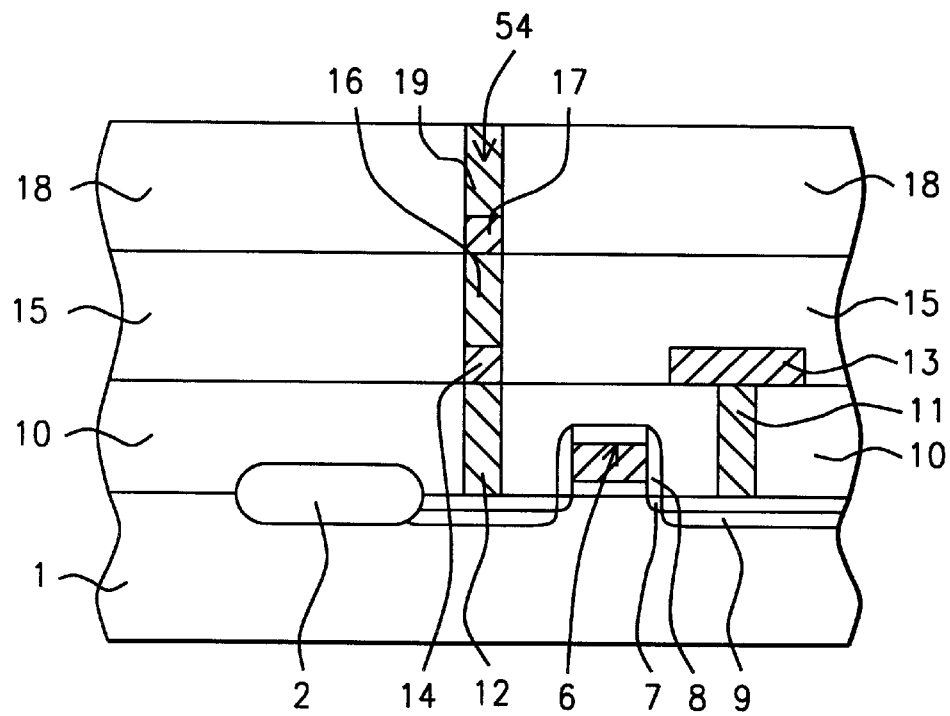

Another metal layer, such as tungsten, is next deposited via LPCVD or R.F. sputtering procedures, to a thickness between about 1000 to 5000 Angstroms. Photolithographic and anisotropic RIE procedures are then used to create second level, DRAM metal interconnect structure 17, schematically shown in FIG. 5, overlying and contacting the top surface of second level, DRAM metal plug 16. The creation of first via hole 53, and of second level, DRAM metal interconnect structure 17, are performed simultaneously with the formation of a via hole and a metal interconnect structure, used for a MOSFET logic device, located on the same semiconductor chip as the DRAM memory device, however not shown in the drawings. Removal of the photoresist shape used for definition of these metal interconnect structures, is again accomplished via plasma oxygen ashing and careful wet cleans. Third insulator layer 18, comprised of silicon oxide, is next deposited via LPCVD or PECVD procedures, to a thickness between about 5000 to 20000 Angstroms, again followed by a CMP planarization procedure, used to create a smooth top surface topography for insulator layer 18. Photolithographic and anisotropic RIE procedures are used to open second via hole 54, in third insulator layer 18, exposing the top surface of second level, DRAM metal interconnect structure 17. A metal layer, such as tungsten, is again deposited using either LPCVD or R.F. sputtering procedures, to a thickness between about 2000 to 5000 Angstroms, completely filling second via hole 54. CMP or selective RIE procedures are again employed to remove unwanted regions of metal from the top surface of third insulator layer 18, creating third level, DRAM metal plug 19, in second via hole 54. This is schematically shown in FIG. 6. The creation of second via hole 54, and the subsequent third level, DRAM metal plug 19, are additional process steps performed after the formation of the last metal level, used for MOSFET logic devices, however the sequence of several metal plugs and several metal interconnect structure, eliminates the creation of deep via holes, presenting high aspect ratios, presenting difficulties when attempting to fill with metal.

Figure 7:
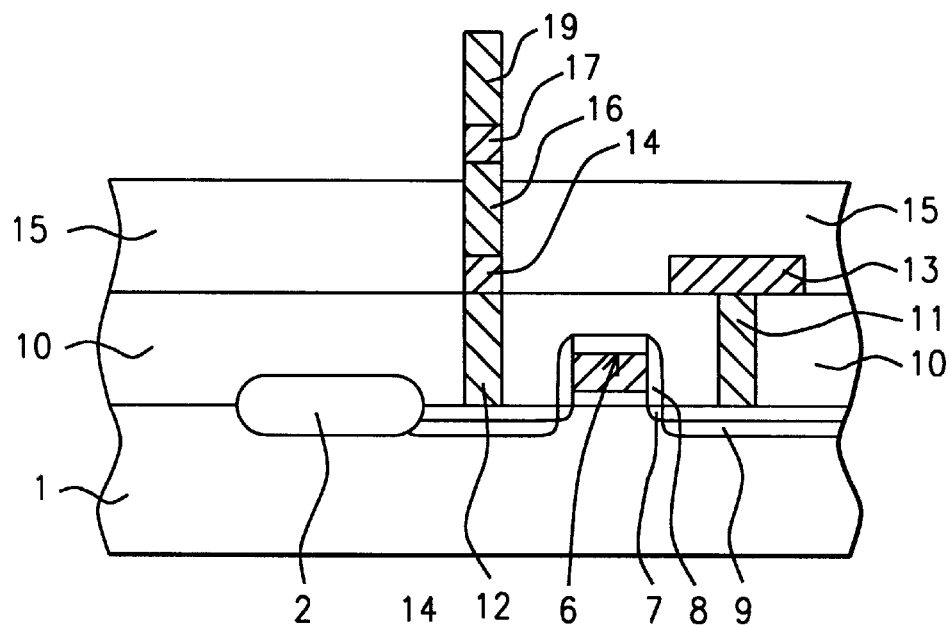

Exposure of the portion of metal plugs, and metal interconnect structures, used for the storage node of the DRAM capacitor structure, is next addressed and schematically shown in FIG. 7. Blanket removal of the third insulator layer 18, and a top portion of second insulator layer 15, between about 1000 to 15000 Angstroms, results in exposure of third level, DRAM metal plug 19, exposure of second level, DRAM metal interconnect structure 17, and exposure of a top portion, between about 0 to 1000 Angstroms, of second level, DRAM metal plug 16. The removal of these insulator layers is accomplished via a selective RIE procedure, using $CHF_3$ as an etchant. The removal can also be accomplished using a buffered hydrofluoric acid solution. The exposed surfaces of these metal plugs and interconnects, will be the surface of the storage node structure, used for the DRAM capacitor structure, with the storage node structure connected to the semiconductor, via the remaining metal plugs and interconnect structures, still embedded with insulator.

Figure 8:
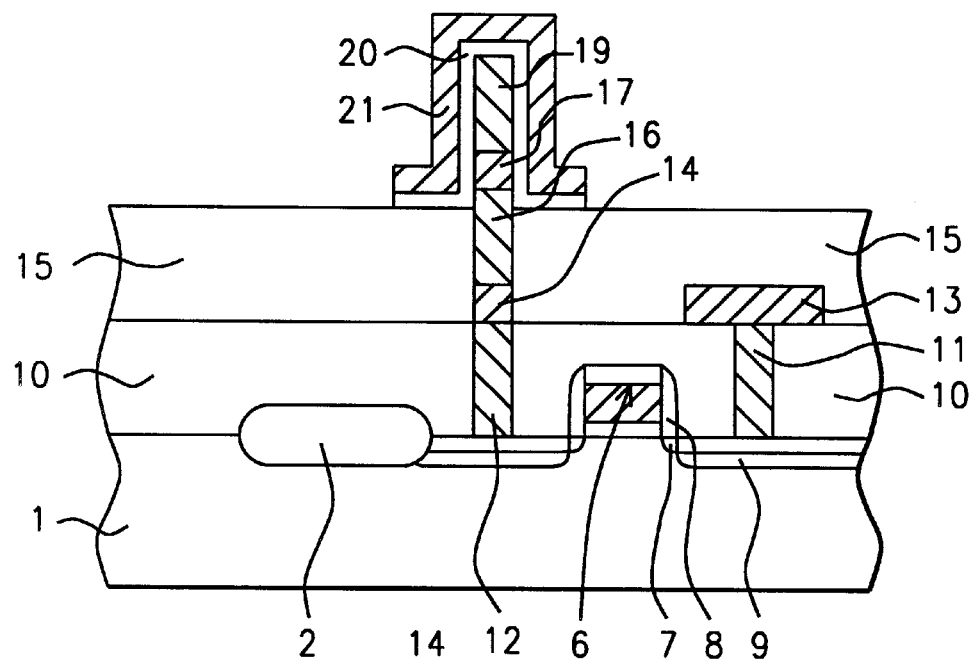

A capacitor dielectric layer 20, such as $Ta_2O_5$, (Ba, Sr) $TiO_3$, or (Sr, Bi) $TiO_3$, is next formed, via R.F. sputtering, or MOCVD procedures. Capacitor dielectric layer 20, is formed to an equivalent silicon dioxide thickness, between about 4 to 50 Angstroms. Another metal layer, such as tungsten, is then deposited via LPCVD or R.F. sputtering procedures, to a thickness between about 1000 to 10000 Angstroms. Finally photolithographic and anisotropic RIE procedures, are employed to create upper metal plate 21. The photoresist shape, used for definition of upper metal plate 21, is removed via plasma oxygen ashing and careful wet cleans, resulting in the DRAM metal capacitor structure, shown schematically in FIG. 8, comprised of upper metal plate 21, capacitor dielectric layer 20, and a storage node structure, in turn comprised of third level, DRAM metal plug 19, second level, DRAM metal interconnect structure 17, and a top portion of second level, DRAM metal plug 16.

Figure 9:
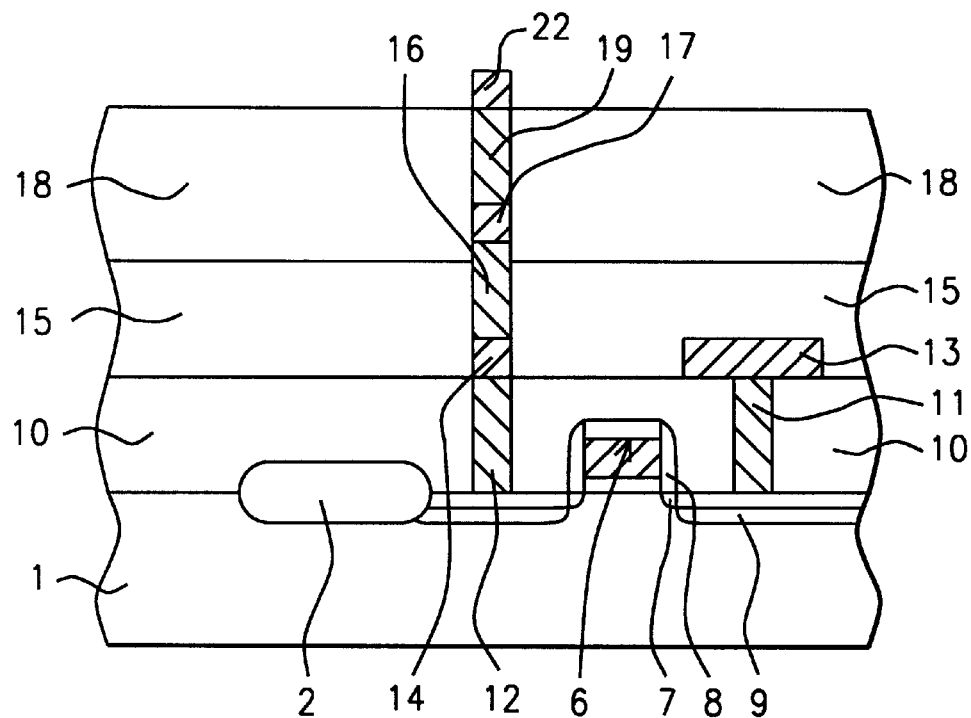
FIGS. 9–11, which schematically, in cross-sectional style, describe a second iteration of this invention in which a DRAM capacitor, storage node structure, is formed with a surface area comprised from a first, and from a second, metal interconnect structure, and from a first metal plug structure, and from a top portion of a second metal plug structure.
Figure 10:
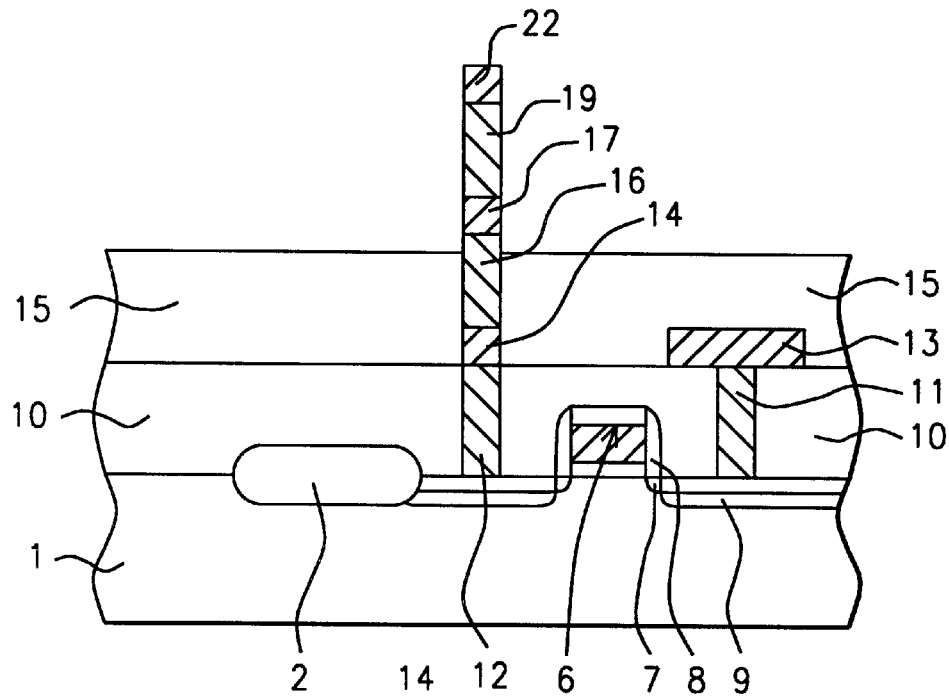
Figure 11:
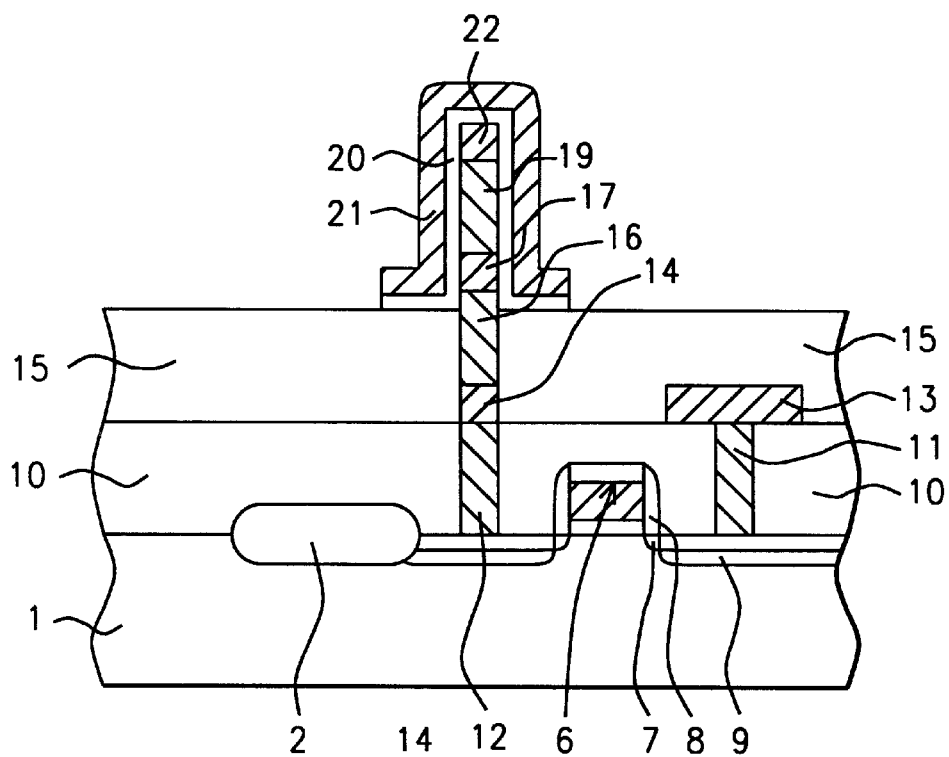

A second iteration of this invention, shown schematically in FIGS. 9–11, is a method for increasing the surface area of the DRAM metal capacitor structure, via the addition of another DRAM metal interconnect structure, on the stack of metal plugs and metal interconnect structures, embedded in insulator, used with the first iteration of this invention, previously shown in FIG. 6. Referring to the structure described in FIG. 6, a metal layer, such as tungsten, is deposited using LPCVD or R.F. sputtering procedures, to a thickness between about 2000 to 5000 Angstroms. Photolithographic and anisotropic RIE procedures, are next employed to create third level, DRAM metal interconnect structure 22, schematically shown in FIG. 9, overlying, and contacting, the top surface of third level, DRAM metal plug 19. Removal of the photoresist shape used to define third level, DRAM metal interconnect structure 22, is accomplished via plasma oxygen ashing and careful wet cleans. Removal of third insulator layer 18, and of a top portion of second insulator layer 15, between about 200 to 1500 Angstroms, is accomplished using identical procedures, previously in the first iteration of this invention, specifically a selective RIE procedure, using $CHF_3$ as an etchant. This procedure results in the exposure of a storage node structure, shown schematically in FIG. 10, comprised of: third level, DRAM metal interconnect structure; third level, DRAM metal plug; second level, DRAM metal interconnect structure; and a top portion of second level, DRAM metal plug. The addition of the third level, DRAM metal interconnect structure, to the storage node stack, allows an increase in surface area, and thus an increase in capacitance and performance, to be realized, compared to counterparts, fabricated using the first iteration. FIG. 11, schematically shows the completion of the DRAM capacitor structure, featuring increased surface area, resulting from addition of third level, DRAM metal interconnect structure 22. Capacitor dielectric layer 20, as well as upper metal plate 21, are comprised of the identical materials, and formed using the identical procedures, previously described for the first iteration of this invention, and previously shown in FIG. 8.

Figure 12:
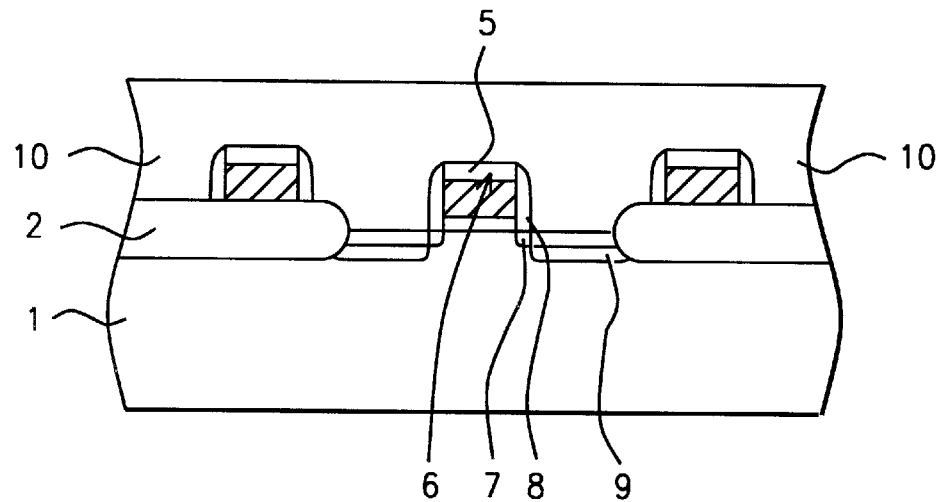
FIGS. 12–14, which schematically, in cross-sectional style, describe a third iteration of this invention, featuring the use of polysilicon contact plugs, self-aligned to transfer gate transistors, connecting an overlying DRAM capacitor structure, comprised with a metal storage node structure, to an underlying source region.
Figure 13:
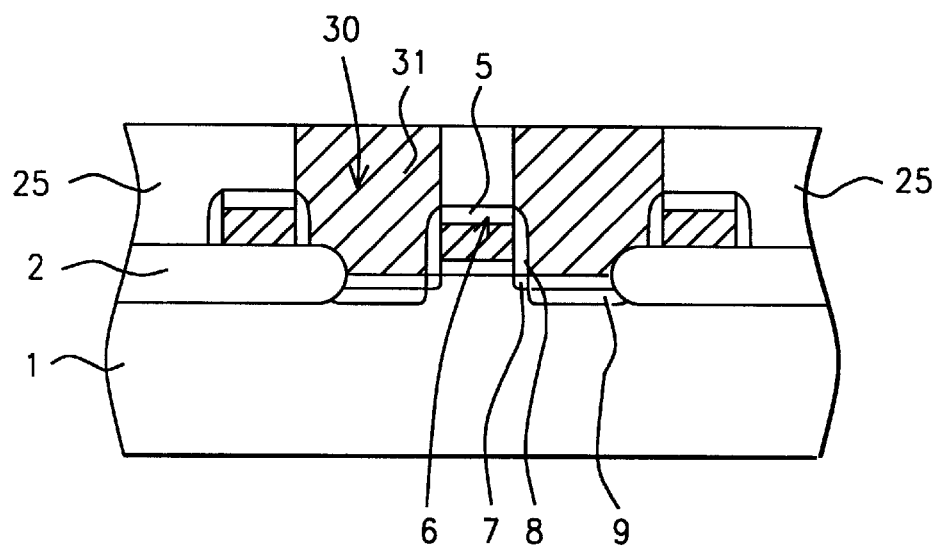
Figure 14:
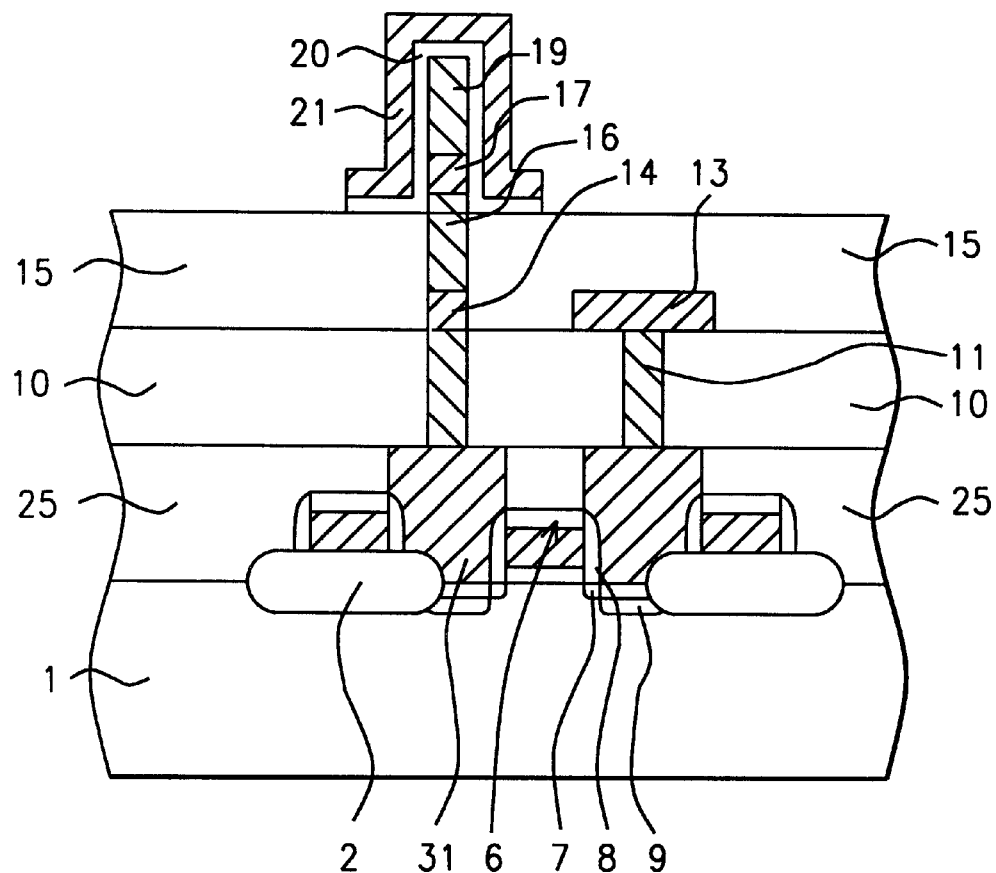

A third iteration of this invention, is the use of self-aligned contacts, (SAC), formed between gate structures, and filled with polysilicon plugs, contacting the source/drain regions, located between the gate structures. The use of polysilicon plugs, in the SAC openings, result in improved junction leakage, when compared to counterparts using tungsten plugs, or narrower diameter, polysilicon plugs. FIG. 12, schematically shows gate structures 6, covered with planarized first insulator layer 10. SAC openings 30, are formed via conventional photolithographic and anisotropic RIE procedures, using $CHF_3$ as an etchant. The use of silicon nitride spacers 8, and of silicon nitride layer 5, allow a the selective RIE procedure, using $CHF_3$ as the etchant, to create a SAC opening, in first insulator layer 25, between gate structures 6, and larger in width than the space between gate structures. A polysilicon layer is next deposited, via LPCVD procedures, to a thickness between about 3000 to 7000 Angstroms, completely filling SAC openings 30. The polysilicon layer can be in situ doped, during deposition, via the addition of arsine or phosphine, to a silane ambient, or the polysilicon layer can be deposited intrinsically, then doped via ion implantation of arsenic or phosphorous ions. A selective RIE procedure, or a CMP procedure, is next used to remove unwanted polysilicon from the top surface of first insulator layer 25, resulting in doped polysilicon plugs 31, in SAC openings 30, contacting source/drain region 9. This is schematically shown in FIG. 13. The DRAM metal capacitor structure, shown schematically in FIG. 14, and comprised of a storage node stack, formed from the same metal plug, and metal interconnect structures, previously described, however is now connected to the source/drain region, via a doped polysilicon plug, in a SAC opening, located between gate structures, thus offering improved junction leakage when compared to counterparts in which the connection of the DRAM metal capacitor, to the source/drain region, was accomplished via metal plugs.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a DRAM capacitor structure, on a semiconductor substrate, comprising the steps of:

forming a transfer gate transistor, on said semiconductor substrate, comprised of an insulator capped, gate structure, on an underlying gate insulator layer, with insulator spacers on the sides of said insulator capped, gate structure, and with source/drain regions, in regions of said semiconductor substrate, not covered by said insulator capped, gate structures;

forming a first, first level, DRAM metal plug, in a first contact hole, in a first insulator layer, contacting an underlying, first source region, in said semiconductor substrate, with said first, first level, DRAM metal plug, used as, and referred to, as a bit line contact plug;

forming a second, first level, DRAM metal plug, in a second contact hole, in said first insulator layer, contacting an underlying, second source region, in said semiconductor substrate, with said second, first level, DRAM metal plug, used as, and referred to, as a storage node contact plug, and said storage node contact plug, fabricated simultaneously with said bit line contact plug;

simultaneously forming a bit line metal interconnect structure, overlying, and contacting the top surface of said bit line contact plug, and a first level, DRAM metal interconnect structure, overlying, and contacting, the top surface of said storage node contact plug;

forming a second level, DRAM metal plug, in a first via hole, in a second insulator layer, with said second level, DRAM metal plug, overlying, and contacting, the top surface of said first level, DRAM metal interconnect structure;

forming a second level, DRAM metal interconnect structure, overlying, and contacting, the top surface of said second level, DRAM plug;

forming a third level, DRAM metal plug, in a second via hole, in a third insulator layer, with said third level, DRAM metal plug, overlying, and contacting, the top surface of said second level, DRAM metal interconnect structure;

removing said third insulator layer, and a portion of said second insulator layer, exposing said third level, DRAM metal plug, said second level, DRAM metal interconnect structure, and a top portion of said second level, DRAM metal plug, and using said third level, DRAM metal plug, said second level, DRAM metal interconnect structure, and the top portion of said second level, DRAM metal plug, as the top portion of a storage node structure, while a bottom portion of a the storage node structure, is comprised of the bottom portion of said second level, DRAM metal plug, said first level, DRAM metal interconnect structure, and said storage node contact plug, with the bottom portion of said storage node structure, contacting a second source region, in said semiconductor substrate;

forming a capacitor dielectric layer on the exposed surfaces of the top portion of said storage node structure; and forming an upper metal plate, on said capacitor dielectric layer, and forming said DRAM capacitor structure, comprised of an overlying, said upper metal plate, said capacitor dielectric layer, and underlying, top portion of said storage node structure.

2. The method of claim 1, wherein said first insulator layer, is silicon oxide, obtained via LPCVD or PECVD procedures, at a thickness between about 5000 to 20000 Angstroms.

3. The method of claim 1, wherein said bit line contact plug, is comprised of tungsten, obtained via LPCVD or R.F. sputtering procedures.

4. The method of claim 1, wherein said bit line contact plug is comprised of polysilicon, obtained via LPCVD or PECVD procedures, and doped in situ, during deposition, via the addition of arsine, or phosphine, to a silane ambient.

5. The method of claim 1, wherein said storage node contact plug is comprised of tungsten, obtained via LPCVD or R.F. sputtering procedures.

6. The method of claim 1, wherein said storage node contact plug is comprised of polysilicon, obtained via LPCVD or PECVD procedures, and doped in situ, during deposition, via the addition of arsine, or phosphine, to a silane ambient.

7. The method of claim 1, wherein simultaneously formed said bit line metal interconnect structure, and said first level, DRAM metal interconnect structure, are comprised of tungsten, at a thickness between about 1000 to 5000 Angstroms.

8. The method of claim 1, wherein said second insulator layer is silicon oxide, obtained via LPCVD or PECVD procedures, at a thickness between about 5000 to 20000 Angstroms.

9. The method of claim 1, wherein said second level, DRAM metal plug, and said third level, DRAM metal plug, are comprised of tungsten, obtained via LPCVD or PECVD procedures.

10. The method of claim 1, wherein said third insulator layer is silicon oxide, obtained via LPCVD or PECVD procedures, at a thickness between about 5000 to 20000 Angstroms.

11. The method of claim 1, wherein said third insulator layer, and a portion of said second insulator, between about 1000 to 15000 Angstroms, is removed via a selective RIE procedure, using $CHF_3$ as an etchant.

12. The method of claim 1, wherein said capacitor dielectric layer is a $Ta_2O_5$ layer, deposited via R.F. sputtering procedures, to a equivalent silicon dioxide thickness, between about 4 to 50 Angstroms.

13. The method of claim 1, wherein said upper metal plate, of said capacitor structure, is comprised of tungsten.

14. A method for fabricating a DRAM capacitor structure, on a semiconductor substrate, featuring a metal storage node structure, comprising the steps of:

providing transfer gate transistors, on said semiconductor substrate, comprised of silicon nitride capped, gate structure, overlying a silicon dioxide gate insulator layer, with silicon nitride spacers, on the sides of said silicon nitride gate structures, and with source/drain regions in regions of said semiconductor substrate, not covered by said silicon nitride capped, gate structures;

self-aligned contact, (SAC), holes, opened in a first silicon oxide layer, between said silicon nitride capped, gate structures, exposing said source/drain regions;

simultaneously forming a first SAC polysilicon plug, in a first SAC hole, and a second SAC polysilicon plug, in a second SAC hole;

forming a first, first level, tungsten plug, in a second silicon oxide layer, overlying, and contacting, the top surface of said first SAC polysilicon plug, with said first, first level tungsten plug, used as, and referred to, as the tungsten bit line plug, while simultaneously forming a second, first level, tungsten plug, in said second silicon oxide layer, overlying, and contacting, the top surface of said second SAC polysilicon plug;

forming a tungsten bit line interconnect structure, overlying, and contacting, the top surface of said tungsten bit line plug, while simultaneously forming a first level, tungsten interconnect structure, overlying, and contacting, the top surface of said tungsten storage node contact plug;

forming a second level, tungsten plug, in a third silicon oxide layer, overlying, and contacting, the top surface of said first level, tungsten interconnect structure;

forming a second level, tungsten interconnect structure, overlying, and contacting, the top surface of said second level, tungsten plug;

forming a third level, tungsten plug, in a fourth silicon oxide layer, overlying, and contacting, the top surface of said second level, tungsten interconnect structure;

completely removing said fourth silicon oxide layer, while removing only a top portion of said third silicon oxide layer, exposing a top portion of said metal storage node structure, comprised of: said third level, tungsten plug; said second level, tungsten interconnect structure; and a top portion of said second level, tungsten plug, while a bottom portion of said metal storage node structure, comprised of: the bottom portion of said second level, tungsten plug; said first level, tungsten interconnect structure; and of said second, first level, tungsten plug, embedded in said third silicon oxide layer, and in said second silicon oxide layer, overlays, and contacts, the top surface of said second SAC polysilicon plug;

forming a capacitor dielectric layer on the surface of the top portion of said metal storage node structure; and forming an upper tungsten plate, on said capacitor dielectric layer.

15. The method of claim 14, wherein said first SAC polysilicon plug, and said second SAC polysilicon plug, are formed from a polysilicon layer, obtained via LPCVD procedures, at a thickness between about 3000 to 7000 Angstroms, with the polysilicon layer doped in situ, during deposition, via the addition of arsine, or phosphine, to a silane ambient.

16. The method of claim 14, wherein said second silicon oxide layer, is obtained via LPCVD or PECVD procedures, at a thickness between about 5000 to 20000 Angstroms.

17. The method of claim 14, wherein said tungsten bit line plug, and said tungsten storage node contact plug, are formed from a tungsten layer, obtained using LPCVD or R.F. sputtering procedures.

18. The method of claim 14, wherein said tungsten bit line interconnect structure, and first level, tungsten interconnect structure, are simultaneously formed from a tungsten layer, obtained via LPCVD or R.F. sputtering procedures, at a thickness between about 1000 to 5000 Angstroms, and patterned via an anisotropic RIE procedure, using $Cl_2$ as an etchant.

19. The method of claim 14, wherein said third silicon oxide layer is obtained via LPCVD or PECVD procedures, at a thickness between about 5000 to 20000 Angstroms.

20. The method of claim 14, wherein said second level, tungsten interconnect structure, is formed from a tungsten layer, obtained via LPCVD or R.F. sputtering procedures, at a thickness between about 1000 to 5000 Angstroms.

21. The method of claim 14, wherein said fourth silicon oxide layer is obtained via LPCVD or PECVD procedures, to a thickness between about 5000 to 20000 Angstroms.

22. The method of claim 14, wherein said third silicon oxide layer, and a top portion of said second silicon oxide layer, between about 1000 to 15000 Angstroms, is removed via a selective RIE procedure, using $CHF_3$ as an etchant.

23. The method of claim 14, wherein said capacitor dielectric layer is a $Ta_2O_5$ layer, obtained via R.F. sputtering procedures, at an equivalent silicon dioxide thickness, between about 4 to 50 Angstroms.

24. The method of claim 14, wherein said upper tungsten plate, is formed from a tungsten layer, obtained using LPCVD or R.F. sputtering procedures, at a thickness between about 1000 to 10000 Angstroms, and patterned via an anisotropic RIE procedure, using $Cl_2$ as an etchant.

* * * * *